Figure 1:
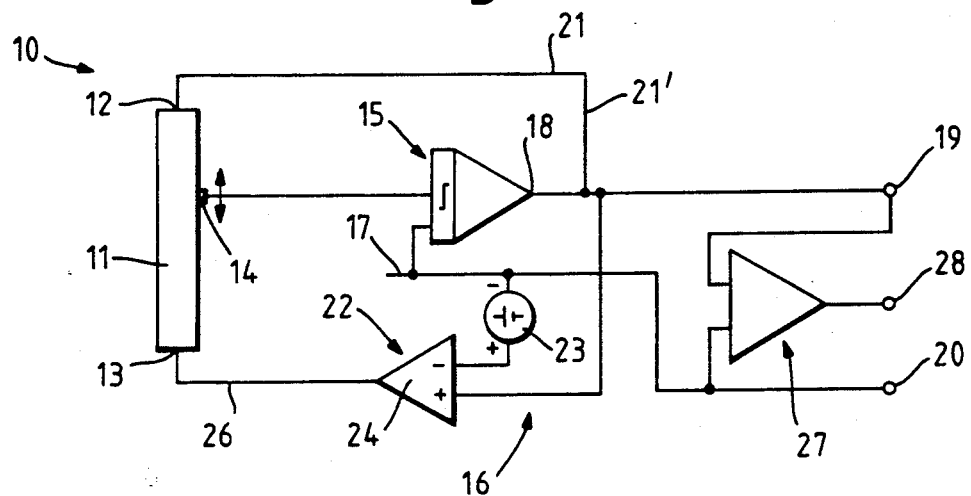

United States Patent [19]

Oswald

[11] Patent Number: 5,079,500
[45] Date of Patent: Jan. 7, 1992

[54] POTENTIOMETRIC CIRCUIT ARRANGEMENT

[75] Inventor: John M. Oswald, Wokingham, England

[73] Assignee: Ferranti International plc, England

[21] Appl. No.: 654,022

[22] Filed: Feb. 12, 1991

[30] Foreign Application Priority Data

Feb. 24, 1990 [GB] United Kingdom ............... 9004204

[51] Int. Cl.⁵ .......................................... G01R 27/14
[52] U.S. Cl. .................................. 323/364; 323/354; 323/298; 323/367; 324/714
[58] Field of Search ............... 323/293, 298, 352, 353, 323/354, 364, 367; 324/691, 713, 714

[56] References Cited

U.S. PATENT DOCUMENTS

| | | | |
|---|---|---|---|
| Re. 33,028 | 8/1989 | Simpson | 323/365 |
| 3,308,375 | 3/1967 | Numakura | 323/298 |
| 3,439,258 | 4/1969 | Leeuwen | 323/367 |
| 3,922,597 | 11/1975 | Nagase | 323/367 |
| 3,967,188 | 6/1976 | Spencer | 323/367 |
| 4,415,790 | 11/1983 | Diesch et al. | 323/366 |
| 4,830,420 | 2/1989 | Steinbrecher et al. | 324/64 |

*Primary Examiner*—Peter S. Wong
*Attorney, Agent, or Firm*—Larson & Taylor

[57] ABSTRACT

A potentiometric circuit arrangement 30 is based on a resistive potentiometer tarck 11 with a capacitively coupled 'wiper' 14', the resistive track being driven by switched alternating voltages of $+/-$ V at 12 and $-/+(X-V)$ at 13, where X is a reference voltage and V is the output of an integrator 15 to which the voltage sensed by the elecrode 37, and rectified at 36, is applied. A null voltage point establishes itself at the position of the electrode and stabilizes the integrator output at a d.c. voltage proportional to the distance of the 'wiper' from the track end 12. Any 'wiper' displacement taps a non-null signal which integrated applies new voltages to the track until the null point is re-established at the 'wiper' position. The capacitive pick-up enables a potentiometer-type voltage output with less wear of the track, less drag against motion and less electrical noise, and electronic differentiation (27) of the position signal to give a rate signal. The arrangement is suited to use as an angle and rate sensor in a gyroscope 70 (FIG. 6).

20 Claims, 10 Drawing Sheets

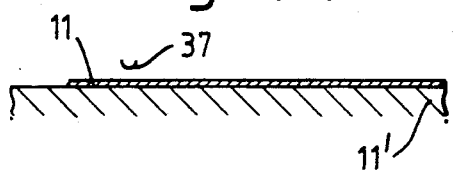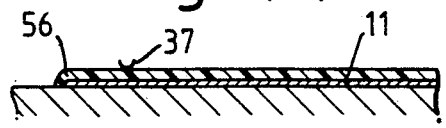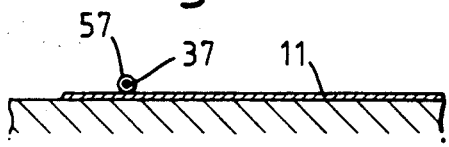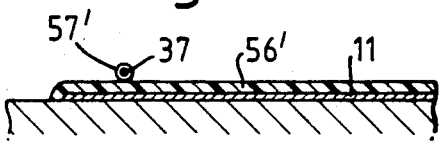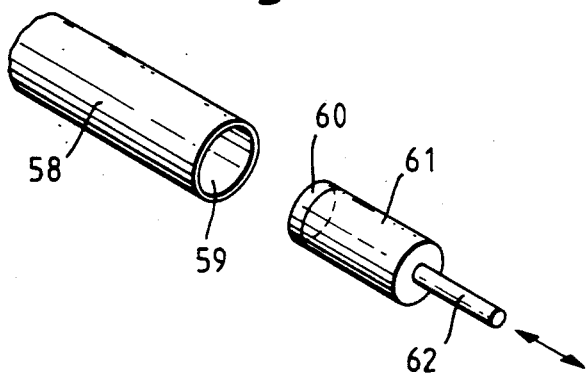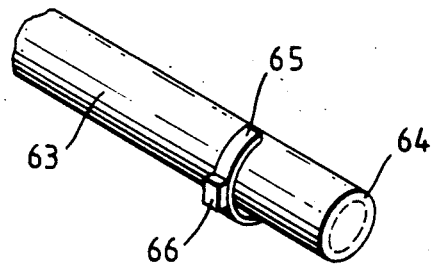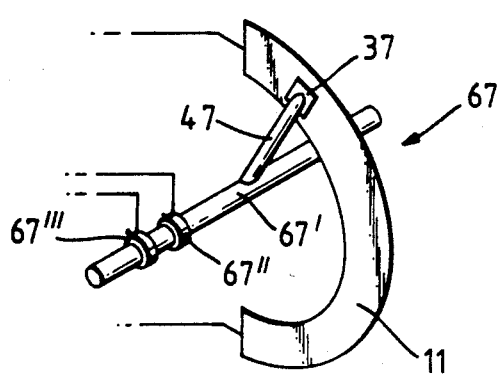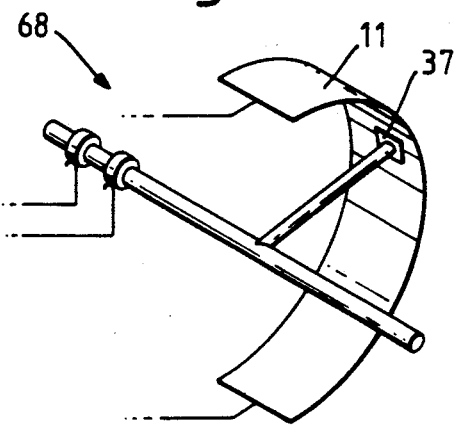

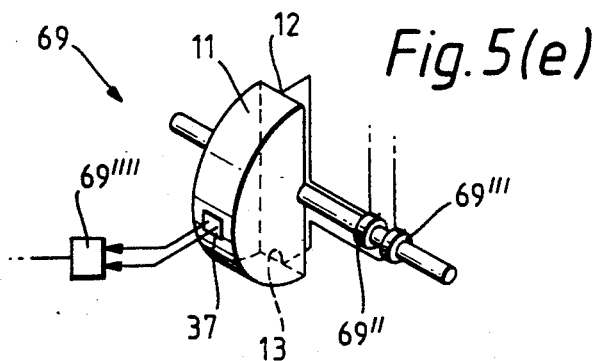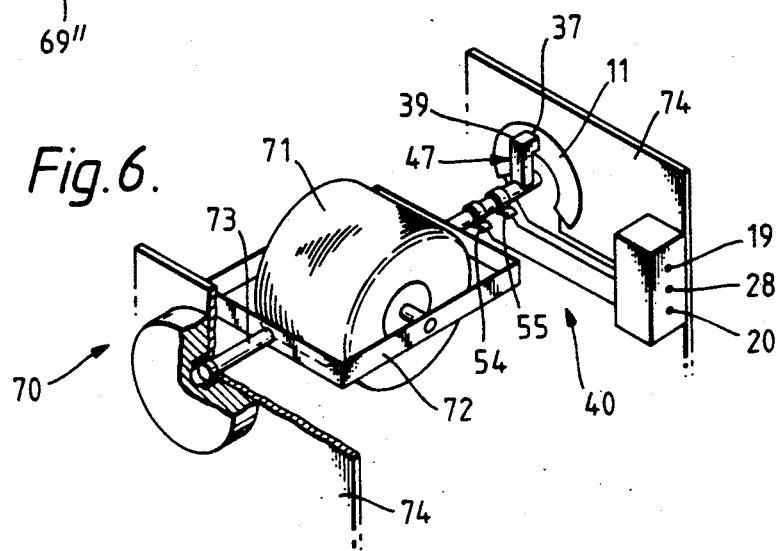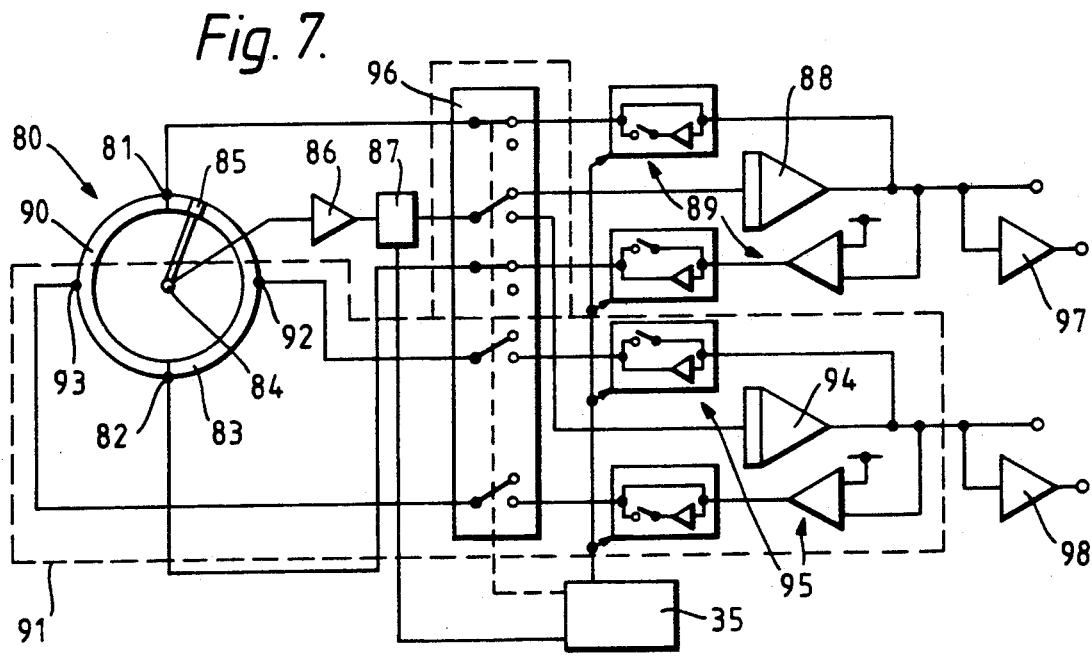

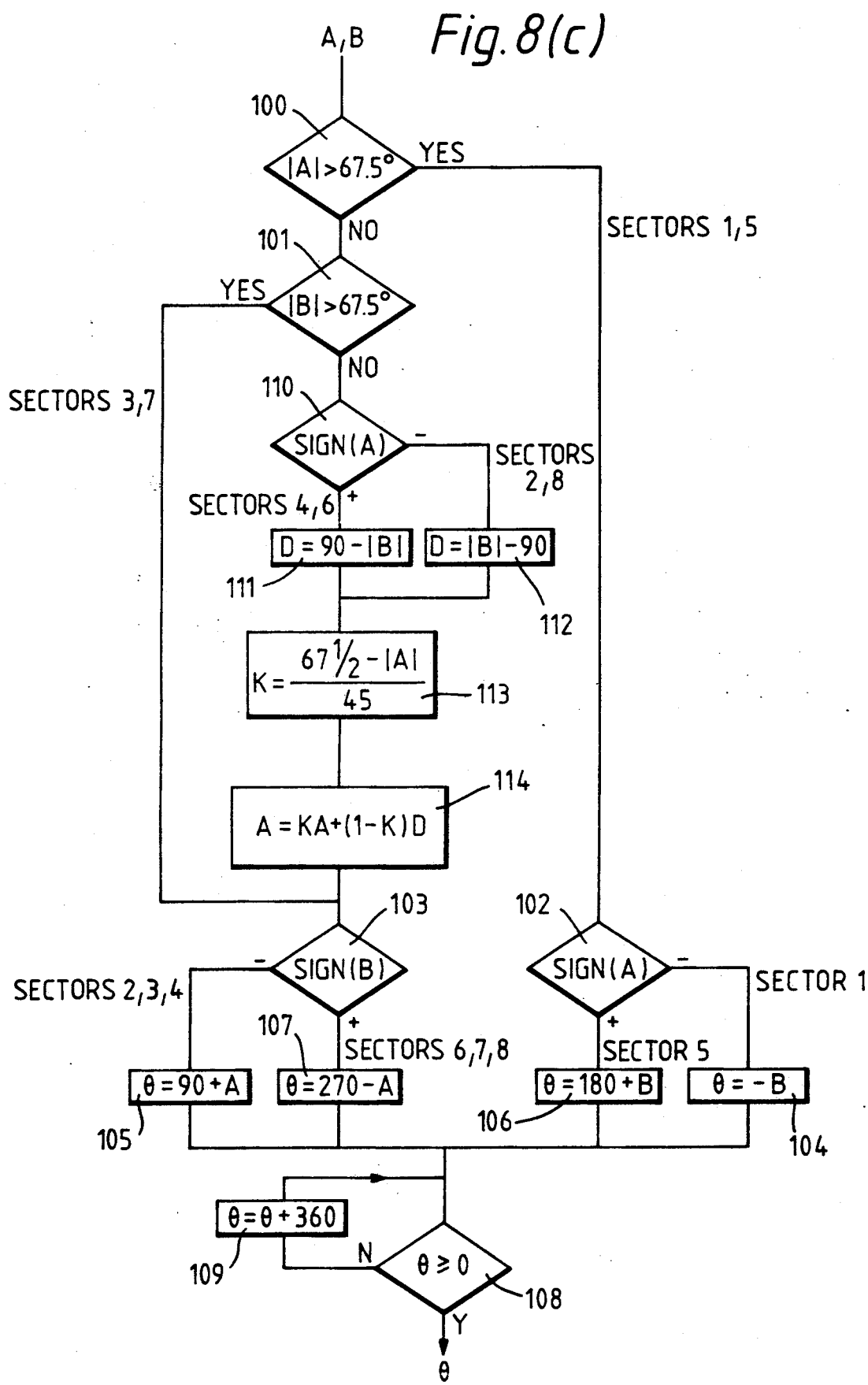

POTENTIOMETRIC CIRCUIT ARRANGEMENT

This invention relates to potentiometric circuit arrangements which provide an electrical signal relating the position of a "movable" part relative to a "fixed" part and to position measuring apparatus based on such potentiometric circuit arrangements. The invention is particularly concerned with providing a potentiometric circuit arrangement suitable for measuring position determination within a sensitive precision instrument for which potentiometer based systems are normally considered unsatisfactory, not least by a sometimes requirement to provide a signal representing rate of change of determined position.

There are many examples of apparatus wherein it is necessary to determine the relative positions of moving parts and sometimes the rate of relative motion. One such apparatus is a gyroscope in which an inertial mass spins within cages or gimbals pivotally mounted on gimbal axes for rotation in different planes relative to each other and to a gyroscope housing.

Such a gyroscope may be employed in determining motion of a vehicle about an axis, the motion being completely described in terms of angular position of the vehicle and rate of rotation. Whereas it is possible in principle to derive orientation rate from an orientation-sensing gyroscope by differentiating its output signal with respect to time electronically, the differentiation amplifies any electrical noise present in the orientation signal and can result in excessive wear and power consumption in any mechanical devices controlled by the rate signal.

Such electrical noise usually originates not in the gyro itself but in the transducer used to measure the gyroscope orientation, the most common transducer form in gyroscopes being the resistive potentiometer in which a wiper contacts, and slides over, a resistive track. Although simple in concept this component has to satisfy criteria other than low noise, requiring good linearity, a low wear rate and good immunity to shock and vibration. Furthermore, to avoid degrading gyroscope performance it must have a very low operating torque. However there is conflict in satisfying these criteria as, for instance, a high contact pressure between wiper and resistive track which provides good shock and vibration performance also gives a high operating torque and possibly excessive wear.

Numerous attempts have been made to produce alternative types of transducer, frequently using magnetic and optical techniques, but often obtaining low noise at the expense of accuracy and linearity provided by the resistive potentiometer and an increased space requirement.

It is frequently preferable to provide the rate signal by means of a separate rate gyroscope, demonstrating that alternatives to the resistive potentiometer for simply and compactly providing displacement and rate signals still leave a requirement for a potentiometer-like arrangement that will satisfy the above outlined conflicting criteria.

Clearly a potentiometer, or a potentiometer-based circuit arrangement, which is able to satisfy these criteria is suited to use in other situations where displacements, suitably detected as movement of a potentiometer wiper or its physical analogue, is required to be manifested as an electrical signal or a desired electrical signal level is to be achieved by effecting such displacement, and with or without any or all of the above discussed criteria applying, and in keeping with the generality of the invention it is a first object of the present invention to provide a potentiometer circuit arrangement which emulates a resistive potentiometer in which at least one of the above-outlined disadvantages of conventional resistive potentiometer are mitigated.

It is a second object of the present invention to provide a potentiometric circuit arrangement able to provide a useful electrical signal differentiated with respect to time or suitable for such differentiation.

Further objects of the present invention are to provide position determining, and particularly angular position determining, arrangements including a potentiometric circuit arrangement.

Yet further objects of the present invention are to provide velocity determining, and particularly angular rotation rate determining, arrangements including a potentiometric circuit arrangement.

According to a first aspect of the present invention a potentiometric circuit arrangement comprises a resistive element extending between two fixed terminals, a signal-tapping member movable along the resistive element to derive a signal from the resistive element and characterised by integration means operable to integrate with respect to an integration datum a signal derived from the signal-tapping member and provide an integrated signal and feedback means including means, including a source of reference voltage of amplitude in excess of the maximum integrated signal amplitude and algebraic summing means, operable to apply to one of said fixed terminals a voltage related to the amplitude of the reference voltage reduced by the amplitude of the integrated signal and means operable to apply to the other of said fixed terminals a voltage related to the amplitude of the integrated signal but of opposite polarity, with respect to the integration datum, to the voltage applied to said one of the fixed terminals such that a voltage having a peak amplitude equal to the reference voltage exists between the fixed terminals and a null voltage, with respect to said integration datum, exists at some position between the fixed terminals, said integration means being responsive to variation of the input signal thereto by displacement of the signal-tapping member from said null voltage position towards either fixed contact to vary the amplitudes of the signals applied to the fixed terminals relative to each other to restore the null voltage to the position of signal-tapping member and to provide said integrated signal amplitude as a function of the position of the signal-tapping member with respect to the fixed terminals.

According to a second aspect of the present invention a potentiometric circuit arrangement as defined in the preceding paragraph includes differentiation means responsive to the integrated signal, representing the position of the signal-tapping member with respect to the fixed terminals, to provide a signal representative of the rate of change of position of the signal-tapping member.

According to a third aspect of the present invention an angular position determining arrangement for determining for a body, mounted for rotation about an axis within a housing, the angular position of the body about said axis with respect to the housing, includes a potentiometric circuit arrangement in which the resistive element is carried by the housing and formed as an arc of a circle centred on said axis and the signal-tapping member is rotatable with the body about said axis.

According to a fourth aspect of the present invention an angular rotation rate determining arrangement for determining for a body, mounted for rotation about an axis within a housing, the rate of change of angular position of the body about said axis with respect to the housing, includes a potentiometric circuit arrangement as defined in the last-but-one paragraph in which the resistive element is carried by the housing and formed as an arc of a circle centred on said axis and the signal-tapping member is rotatable with the body about said axis.

Figure 2:
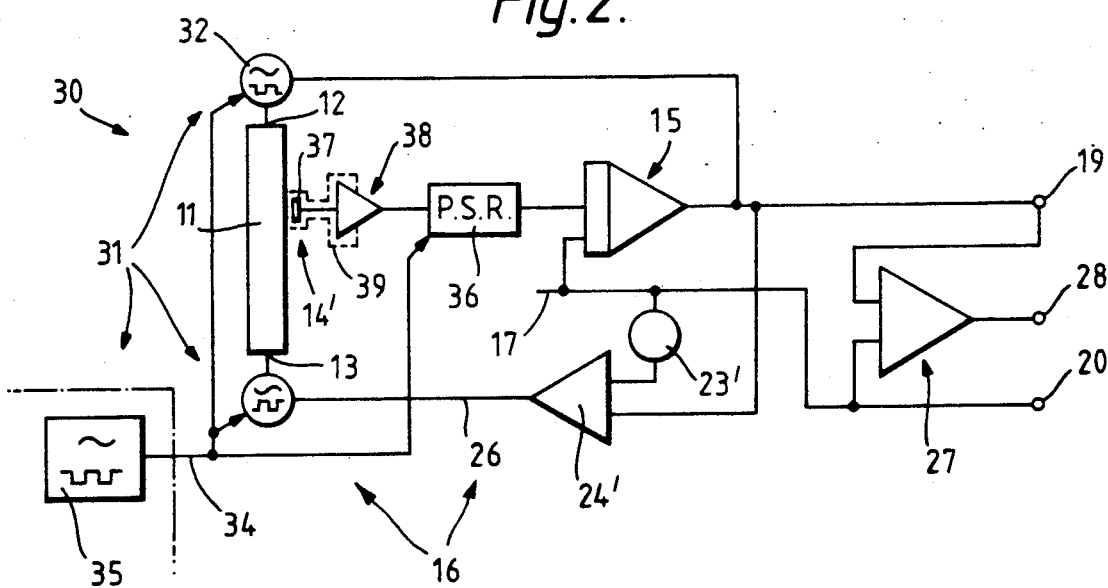
Figure 13:
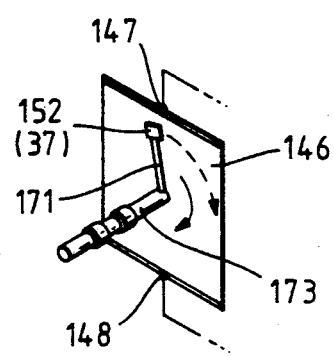
Figure 3:
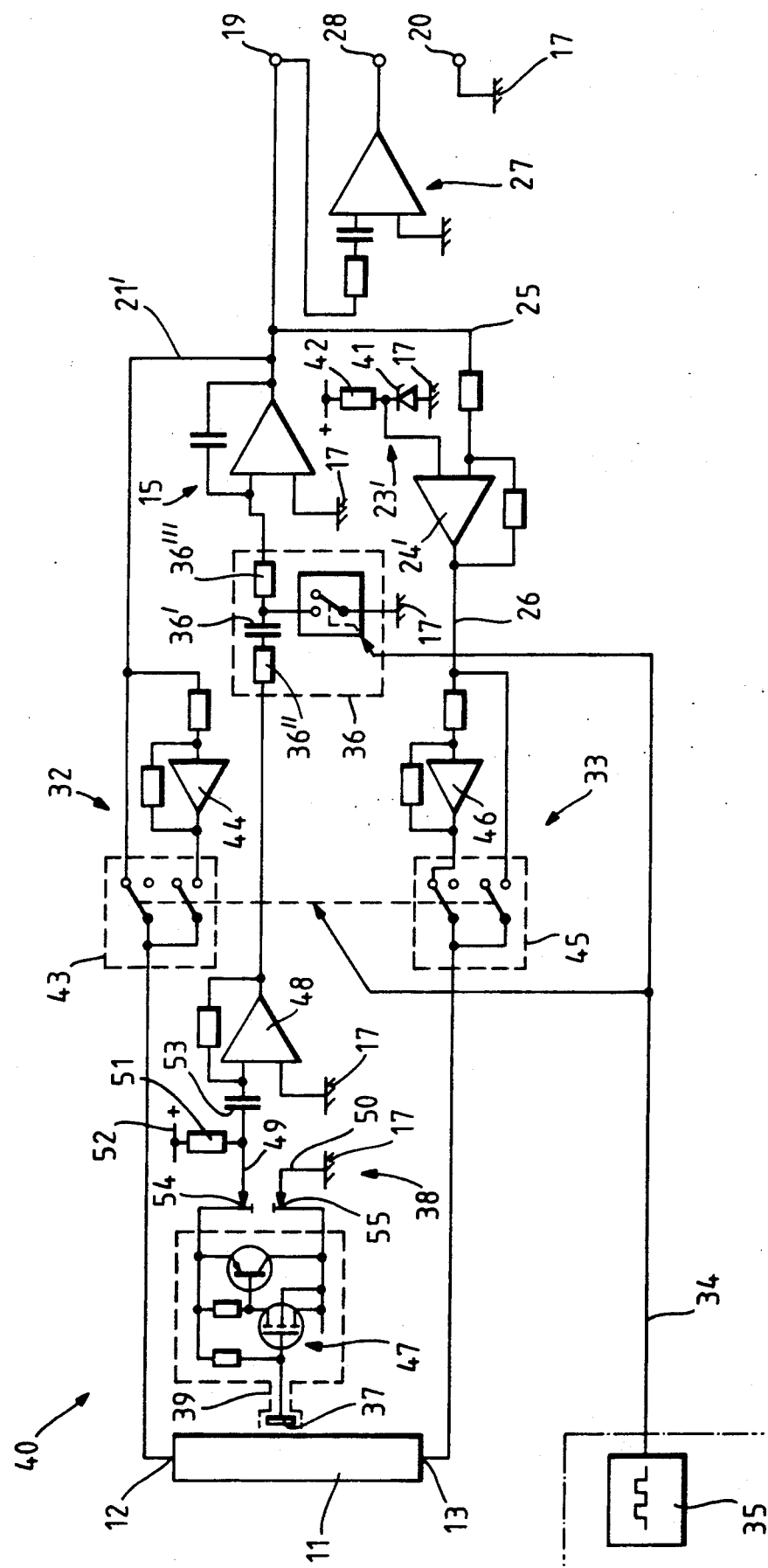
Figure 8A:
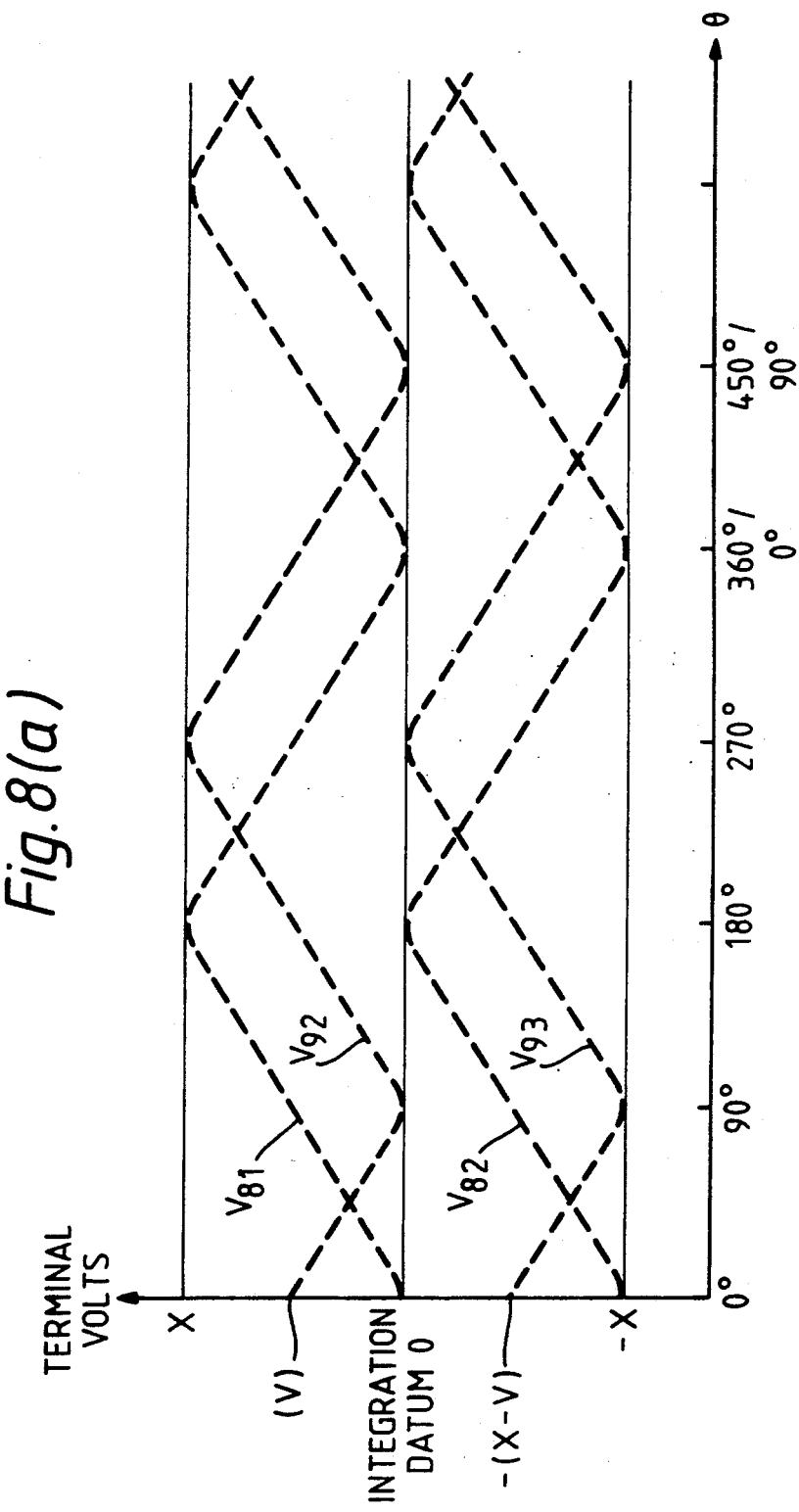
Figure 8B:
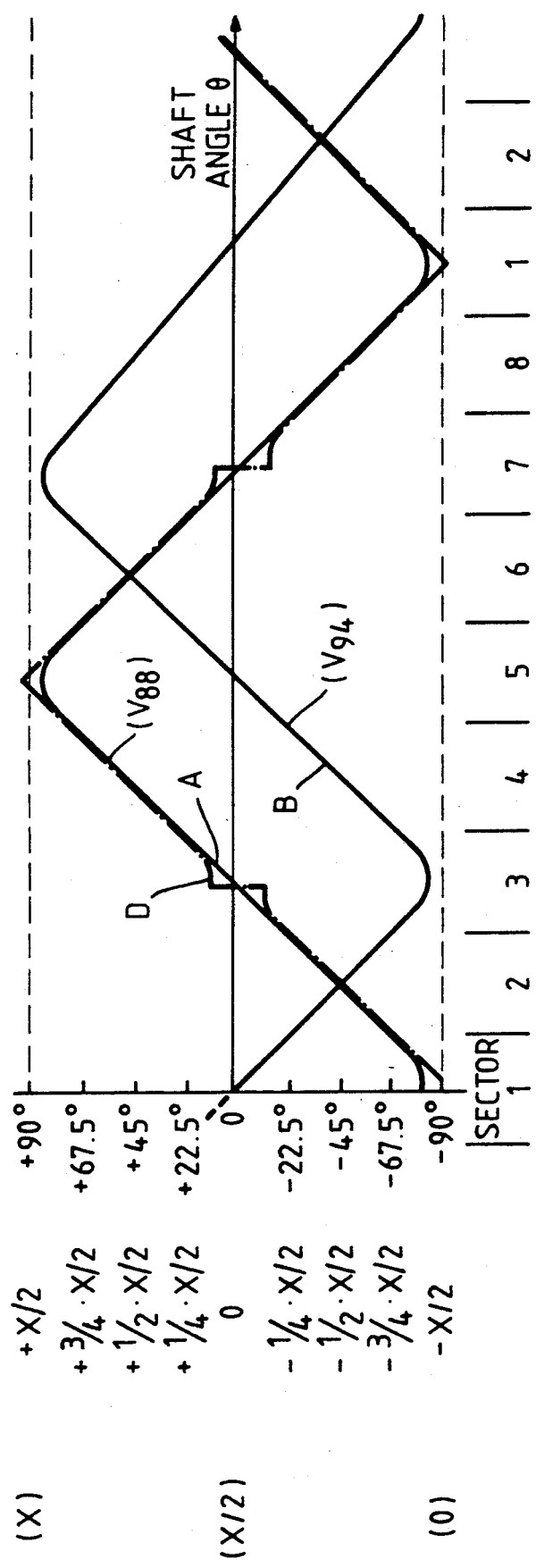
Figure 8D:
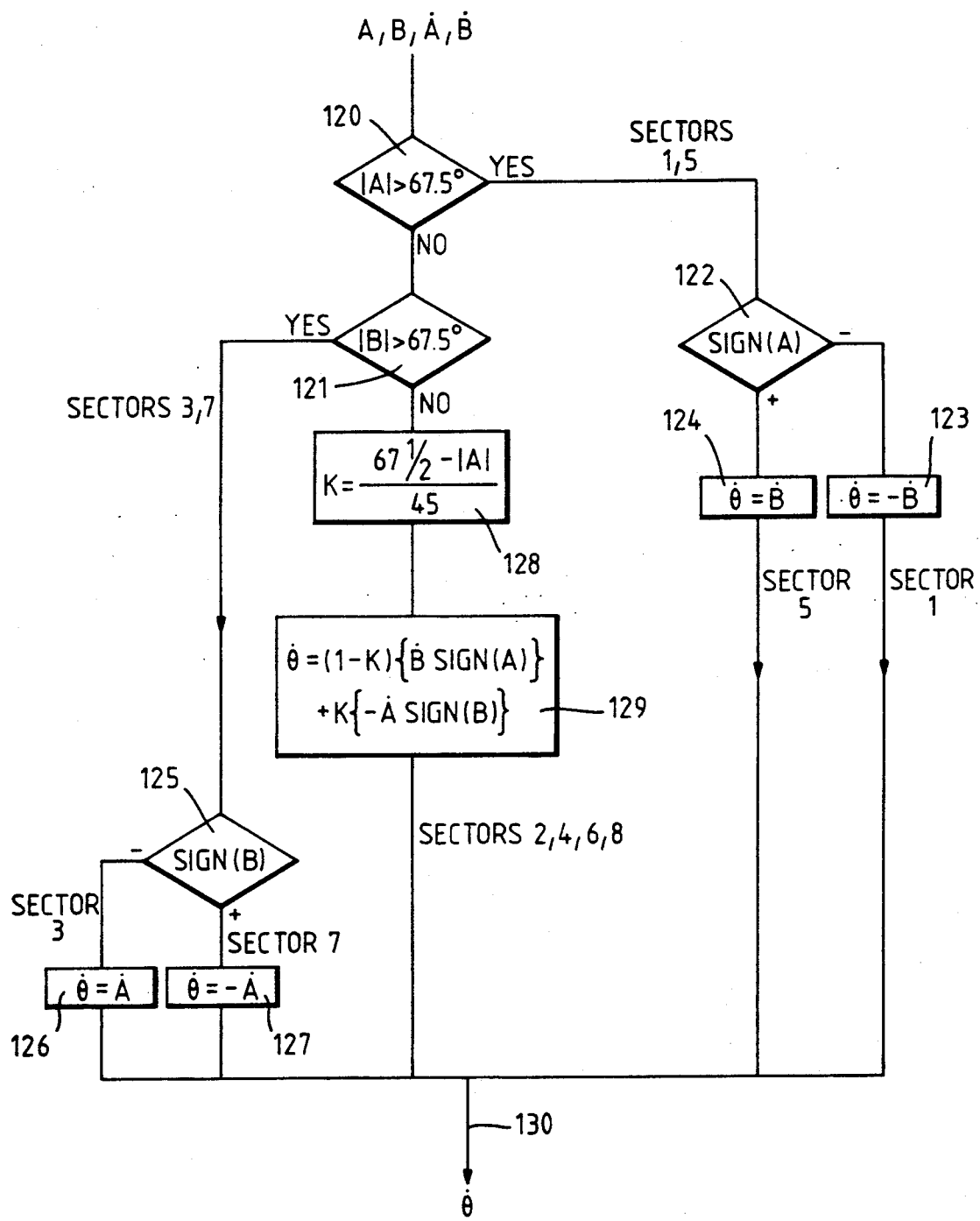
Figure 9:
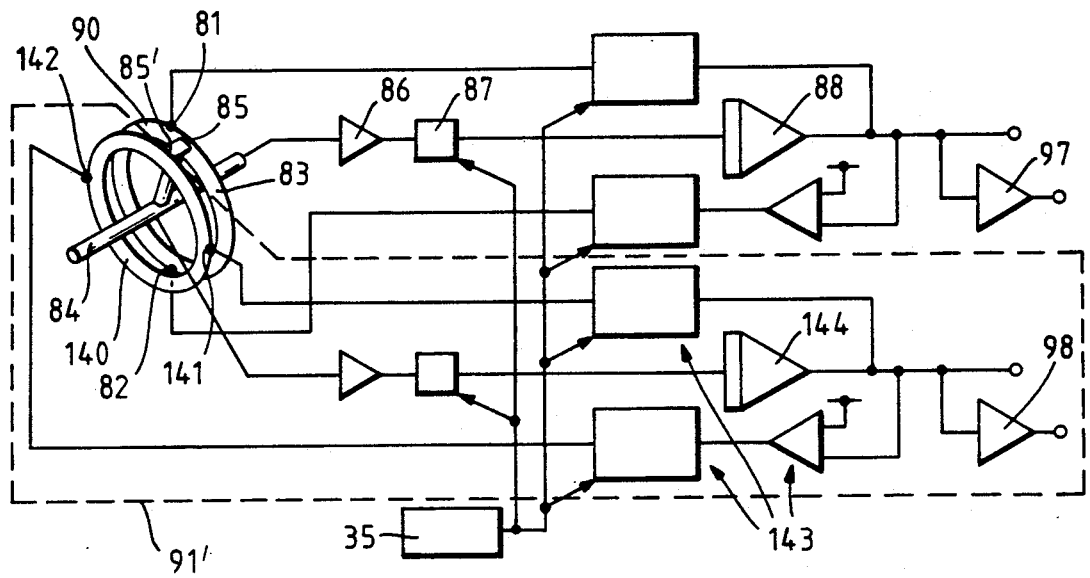
Figure 10:
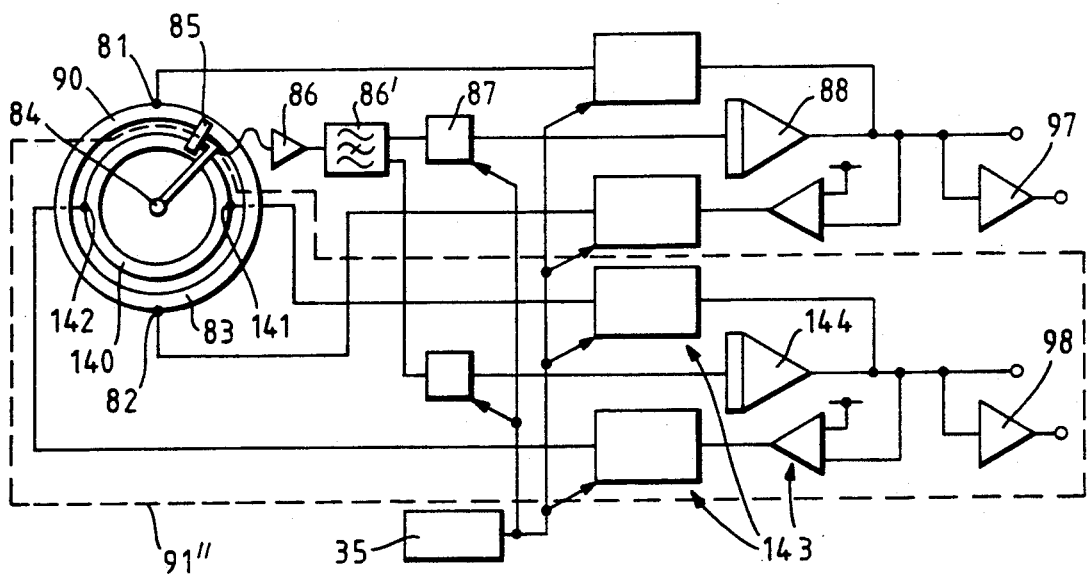
Figure 11:
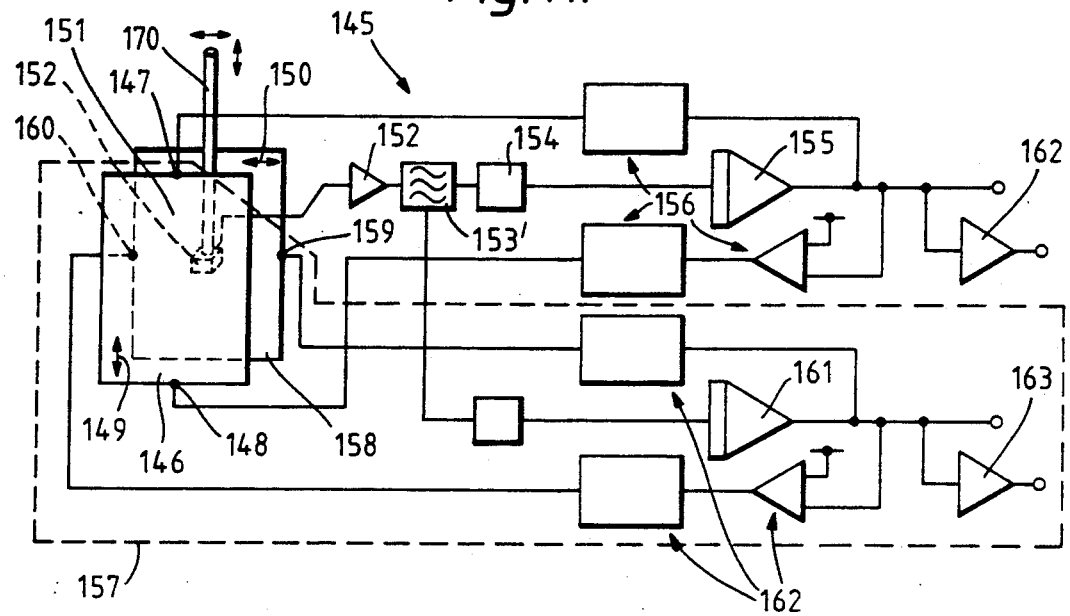
Figure 12:
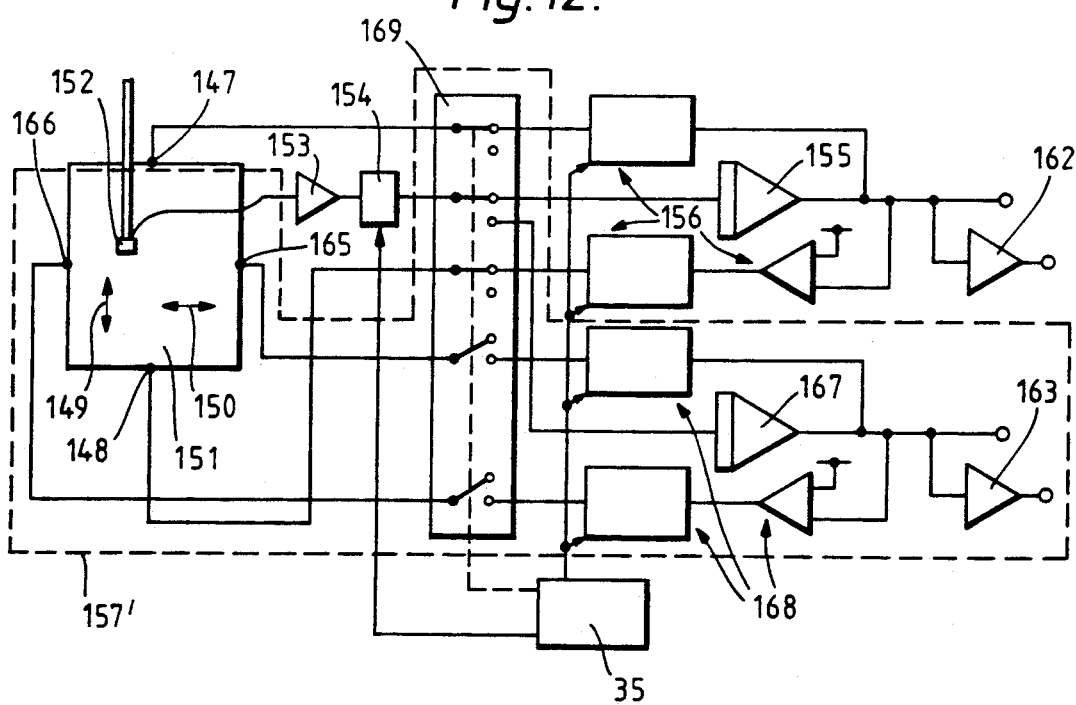

Embodiments of the invention will now be described by way of example with reference to the accompanying drawings, in which:

FIG. 1 is a schematic circuit diagram of a basic form of potentiometric circuit arrangement according to the present invention, including a resistive potentiometer having fixed resistive element and movable signal-tapping member, to illustrate its principle of operation, FIG. 2 is a schematic circuit diagram of the arrangement of FIG. 1 including a.c. energisation of the potentiometer resistive element and an optionally contactless signal-tapping member, also to illustrate its principle of operation, FIG. 3 is a circuit diagram of a more practicable form of the arrangement of FIG. 2, FIG. 4(a) is a sectional elevation through a planar form of resistive element and planar movable signal-tapping member showing an air gap between them as dielectric, FIG. 4(b) is a sectional elevation through an alternative form of resistive element and signal-tapping member showing a solid dielectric coating on the resistive element and the signal-tapping member bearing on the coating, FIG. 4(c) is a sectional elevation through yet another form of resistive element and signal-tapping member showing a solid dielectric material formed as a roller on the signal-tapping member and bearing on the resistive element whereby the separation between element and member is maintained during member displacement with little frictional resistance or wear on the resistive element, FIG. 4(d) is a sectional elevation through a further form of resistive element and signal-tapping member, similar to FIG. 4(c) but with a thin protective coating of dielectric material on the resistive element, FIG. 5(a) is a perspective view of an alternative non-planar configuration of resistive element, showing it as a hollow cylindrical element with the signal-tapping member movable axially through the cylinder, FIG. 5(b) is a perspective view of a configuration similar to FIG. 5(a) but in which the signal-tapping member is in the form of a saddle movable axially along the outside of the cylinder, FIG. 5(c) is a perspective view of yet an alternative configuration of resistive element showing it as a flat arcuate track along which moves a signal-tapping member upon rotation of a shaft carrying the number, FIG. 5(d) is a perspective view of a further configuration of resistive element formed as part of a cylindrical wall surrounding a rotational shaft carrying the signal-tapping member, FIG. 5(e) is a perspective view of yet a further configuration of potentiometer circuit arrangement similar to FIG. 5(d) in which the resistive element is carried by the shaft, FIG. 6 is partly cut-away perspective view of a single axis gyroscope illustrating a shaft rotation measuring arrangement according to the present invention, employing a potentiometric circuit arrangement, FIG. 7 is a schematic circuit diagram of a potentiometric circuit arrangement with an arcuate resistive element and rotatable signal-tapping member adapted to accommodate rotation of the signal-tapping member through 360°, including means for resolving rotational position ambiguity, FIG. 8(a) shows relationships between rotational position of the signal-tapping member and resistive element energising voltages in the arrangements of FIG. 7, FIG. 8(b) is a graphic illustration of the integrated signal voltages as a function of rotational position of the signal-tapping member, corresponding to FIG. 8(a), for the purpose of explaining combination of the signals to resolve ambiguity and mitigate the effect of non-linearity at the rounded signal peaks, FIG. 8(c) is a flow chart illustrating the steps of resolving ambiguity of rotational position applicable to digital signal processing, FIG. 8(d) is a flow chart similar to FIG. 8(c) but showing the steps of resolving ambiguity in relation to determining rotational rate, FIG. 9 is a schematic circuit diagram of a potentiometric circuit arrangement similar to that of FIG. 7 but including a different form of means for resolving rotational position ambiguity, FIG. 10 is a schematic circuit diagram of a potentiometric circuit arrangement similar to that of FIG. 9 but including an alternative form of resistive element structure and yet another form of means for resolving rotational position ambiguity, FIG. 11 is a schematic circuit diagram of a potentiometric circuit arrangement with a resistive element extensive in, and a signal-tapping member movable in, two orthogonal directions, including coordinate resolving means, FIG. 12 is a schematic circuit diagram of a potentiometric circuit arrangement similar to that of FIG. 11 but showing an alternative form of coordinate resolving means, and FIG. 13 is a schematic diagram of part of the potentiometric circuit arrangement of FIG. 11 or FIG. 12 having a signal-tapping member movable in circular motion by rotation of a shaft, being arranged to provide position signals which vary sinusoidally as a function of shaft rotational position.

Referring to FIG. 1 a potentiometric circuit arrangement 10 in accordance with the present invention comprises a resistive element 11 extending between two 'fixed' terminals 12 and 13, a signal-tapping member 14, movable along the resistive element to derive a signal from the resistive element, integration means 15 for the derived signal and feedback means 16.

The signal-tapping member may make contact with the resistive element (corresponding to the wiper of a conventional resistive potentiometer) or be insulated therefrom and require a.c. coupling as described below. The tapped signal, representing a proportion of the voltage difference between the fixed terminals in dependence upon the position of the tapping member, is applied to the integration means 15. Integration is performed on the tapped signal in relation to an integration datum potential on bus 17, conveniently at zero volts or ground potential, and involves polarity reversal of the signal relative to the datum. The signal provided by the integration means at 18 is also presented as the circuit arrangement output at terminals 19 relative to datum bus terminal 20.

The integrated signal is also applied to the feedback means 16. The feedback means 16 includes means 21, to apply a signal having an amplitude related to the integrated signal to the fixed terminal 12, this being shown as a simple connecting line 21' which applies the integrated signal itself. The feedback means 16 also includes means 22 which applies to the fixed terminal 13 a signal having an amplitude related to the algebraic sum of said integrated signal and a reference signal of opposite polarity, with respect to the integration datum, to said integrated signal. The means 22 comprises a reference voltage generator 23, algebraic summing means 24, arranged to receive an input from the generator 23 comprising a predetermined reference voltage with respect to the integration datum and an input on line 25 from the integration means comprising the integrated signal, and a line 26 connecting the output of the summing means to the fixed terminal 13. In practice the algebraic summing means 24 may be arranged to subtract from the integrated signal a reference signal which is of the same polarity as the integrated signal or to subtract the integrated signal from said reference signal of same polarity with polarity inversion.

As will become apparent, the polarity of the integrated signal, and thus the output signal of the arrangement, is in fact determined by the polarity chosen for the reference voltage.

Considering operation of the circuit arrangement, if the generator 23 produces a reference voltage which is positive with respect to the integration datum and of amplitude X volts, in excess of the maximum amplitude of signal produceable by the integration means, and the integration means initially produces an integrated signal of zero amplitude with respect to the datum, then fixed terminal 12 is initially at zero volts and terminal 13 at $-X$ volts. The signal-tapping member, if not at terminal 12, will tap a signal voltage negative with respect to the integration datum and supply this to the integration means which will, in turn, reverse polarity and provide a positively increasing integrated signal. The voltage on fixed terminals 12 and 13 will thus go more positive with respect to the integration datum and the zero volts, or null, point will travel along the track from terminal 12 towards the position of the signal-tapping member. As it approaches, the signal tapped will fall in magnitude and the output of the integration means, the integrated signal, will stabilise at some positive level $+V$. The voltage levels at fixed terminals 12 and 13 will thus be $+V$ and $-(X-V)$ respectively.

It will be appreciated that with a reference voltage negative with respect to the integration datum, that is, $-X$, the integrated signal will stabilise at $-V$.

If the tapping member is displaced from the position at which the integrated signal/output signal has stabilised towards one of the fixed terminals then a non-null voltage, which may have either positive or negative polarity with respect to the integration datum, is input to the integration means with the result that the amplitude of the output changes from V and the distribution of voltage between fixed terminals 12 and 13 will be such that the null voltage point moves in relation to the terminals. At some integrated signal level V' the distribution of voltage between the terminals is such that the null voltage point coincides with the signal-tapping member, at which time the signal applied to the integration means is reduced to zero and the integrated signal becomes settled at V'.

It will be appreciated that if the signal-tapping member is caused to take up a position adjacent the fixed terminal 12 the amplitude of the integrated signal (and circuit output between terminals 19 and 20) will be zero volts whilst if caused to take up a position adjacent the fixed terminal 13 the amplitude of the integrated signal will be X volts. Assuming a length L of resistive elements between the fixed terminals then at any position of the signal-tapping member intermediate the fixed terminals, say at displacement d from terminal 12, that gives an output signal amplitude V, the null point will also stabilise at said distance d from terminal 12 whereby $$d/(L-d) = V/(X-V)$$

and $$d = V.(L/X) \qquad (1)$$

and $$V = d.(X/L) \qquad (2)$$

X and L are constants and their ratio may be accommodated by a scaling factor of the integration means or any subsequent circuitry.

The circuit arrangement thus behaves like a resistive potentiometer in that it can provide an output signal level which is directly proportional to the position of the signal-tapping member between the fixed terminals, whether the output signal level V is a measure of an unknown tapping-member position d, equation (1), or has a value generated by deliberately positioning the tapping member, equation (2).

It will be appreciated that when the signal-tapping member is displaced from any position at which a voltage null is established, the integrated signal/output signal is inaccurate until the null establishes itself at the new position of the signal-tapping member. Clearly, with extremes of long integration times and rapid frequent displacement the integrator may not settle to provide an accurate output signal. However by choosing integration times appropriate to the mechanical bandwidth associated with physical means of displacing the tapping member it can provide a suitable output signal. What is valuable in practice and compensates for the above is that the motion of the null point follows displacement of the signal-tapping member so that the tapping point deals only with low level signals and is less likely to be a source of high level noise signals induced in the resistive element or caused by poor contact with, or imperfections in, the resistive element, and any noise signals which are present are furthermore reduced by the integration.

Such potentiometric circuit arrangement 10 is suited to incorporating, or supplying the output signals at 19 and 20 to, a differentiation circuit as shown at 27 for providing between further output terminal 28 and terminal 20 a signal which is the derivative with respect to time of the integrated signal and representing the rate of change of position of the signal-tapping member.

It will be appreciated that the integration means may function without polarity inversion if such inversion is achieved between its output and the terminals 12 and 13, in the latter case by removing existing inversion achieved by the algebraic summing means 24 and/or reference generator 23.

Notwithstanding the options available, the fixed terminals polarities are opposite to each other, with respect to the integration datum, and there are advantages to energising the resistive element with fixed terminal voltages whose instantaneous values with respect to the integration datum vary together cyclically as a function of time at a higher rate than variations permitted of relative movements of the signal-tapping member along the resistive element. Such variation may compare the varying of the fixed terminal voltages either by controlling the levels of voltage from antiphase a.c. generators in accordance with the above defined terminal voltages V and $-(X-V)$ and the integration datum level or by 'chopping' the aforementioned fixed terminal voltages V and $-(X-V)$ between the current relatively slowly varying levels and the integration datum. Preferably such variation includes alternating the polarities of voltages applied to the two fixed terminals. Such polarity alternation may be effected by controlling the levels of voltage from antiphase a.c. generators in accordance with the above defined terminal voltages V and $-(X-V)$ or by 'chopping' the above defined terminal voltages between positive and negative values of V or $-(X-V)$ respectively. Such 'chopping' of an erstwhile d.c. voltage between its d.c. volume and its polarity inverse derives an a.c. energising signal which enables the instantaneous voltage between the two fixed terminals to be the reference voltage X, giving maximum sensitivity to signal-tapping member displacement throughout the energising variation cycle, whilst also eliminating from the resistive element an average steady, or d.c., voltage relative to the integration datum that leaves the signal-tapping member to respond only to changes or 'errors' in energising voltage.

Referring to FIG. 2, this shows a schematic potentiometric circuit arrangement 30 similar to 10 of FIG. 1 but including modifications associated with a.c. operation, that is, the application of energising voltages of alternating polarity to the resistive element. Parts corresponding to those shown in, and described above in relation to, FIG. 1 are given the same reference numbers.

The potentiometric circuit arrangement 30 comprises resistive element 11 having fixed terminals 12 and 13, a signal-tapping member 14', described further hereinafter, integration means 15, feedback means 16', output terminals 19, 20 and optional differentiation means 27 employing further output terminal 28 and terminal 20.

The feedback means 16' includes a.c. generating means 31 in the form of a first a.c. generator 32 connected to supply the fixed terminal 12 and a second a.c. generator 33 connected to supply the fixed terminal 13. Both generators produce signals of alternating polarity with respect to the integration datum 17, produce signals in antiphase and are maintained in relative phase by a synchronising signal on line 34 from an integral or external synchronisation generator 35.

The algebraic summing amplifier 24' is arranged to receive a d.c. reference voltage ($\pm X$) from reference generator 23' of the same polarity as the integrated signal ($\pm V$) and substract that from the integrated signal on line 25 providing the difference $\pm(X-V)$ on the line 26.

The lines 21' and 26 control the amplitudes of the a.c. generators 32 and 33 respectively. It will be seen that by having generator 33 produce a signal in antiphase to generator 32, the generator is in effect inverting the polarity of its amplitude-controlling signal from algebraic summing means 24' so that the controlling signal is in effect the sum of the integrated signal and a reference signal of opposite polarity to the integrated signal described for arrangement 10.

Any non-null signal tapped from the resistive element by the member 14' will be an a.c. signal and the arrangement 30 further includes rectification means 36 between the signal-tapping member and the input to integration means 15 in order to restore a d.c. or unipolar input level with respect to the integration datum. The rectification means 36 preferably comprises a phase sensitive rectifier connected to line 34 and under the control of synchronisation generator 35.

It will be appreciated that the waveforms of the signals produced by the a.c. generators 32 and 33 is a matter of choice. However there are practical advantages in terms of circuit simplicity, from using a square waveform signal derived from the essentially d.c. signal fed back from the integration means on lines 21' and 26, the generators 32 and 33 then comprising switches of the polarities of the d.c. feedback signal voltages under the control of a square wave synchronisation generator 35.

A.c. energisation of the resistive element 11 enables transformer isolation (not shown) of the resistive element 11 and signal-tapping member, permitting its safe use in explosive environments or high voltage applications.

A further and more useful advantage of using a.c. energisation of the resistive element 11 is enabling the signal-tapping member 14' to be non-contact-making with the element and take the form of a tapping electrode 37 capacitively coupled to the resistive element by way of a dielectric material such as air or suitable solid material.

The tapping electrode 37 senses the spatial average of voltage over the region of resistive element to which it is adjacent. When displaced, the electrode produces a sensed signal which is less susceptible than a conventional point-contact-making wiper member to microscopic imperfections in the resistive element and in their contact and is thus relieved of spatial noise and non-linearity associated with wiper position, and change of position, caused thereby.

The signal that the electrode senses from the resistive element is amplified by amplification means 38 before being fed to rectification means 36. The amplification means includes a preamplifier, described hereinafter, coupled to the tapping electrode 37 and that electrode, and preferably the preamplifier, are provided with an electrostatic screen 39 to further reduce electrical pick up from anything but the resistive element. Interference by noise from any nearby switching circuits, such as switch-mode power supplies, may also be minimised by choosing the switching frequency of synchronisation generator 35 different from such circuit.

There are other benefits and improvements which are more readily seen and appreciated in FIG. 3, which represents a more practicable embodiment 40 of the arrangement 30 described above. Again, parts which are common thereto are given like reference numbers.

Referring to FIG. 3 the integration means 15, algebraic summing means 24' and optical differentiation means 27 all comprise conventional constructions of operational or the like amplifiers with passive input and feedback components and, as such, require no further description.

The reference voltage generator 23' comprises a simple potential divider including voltage defining zener diode 41, connected between a positive supply rail 42 and the integration datum 17.

The a.c. generator 32 comprises a two-state switching means 43 arranged in a first state (shown) to connect the integrated signal on line 21' to the fixed terminal 12 directly and in a second state by way of inverting amplifier 44.

The a.c. generator 33 comprises a similar two-state switching means 45 arranged in a first state (shown) to connect the signal on line 26 to the fixed terminal 13 by way of inverting amplifier 46 and in a second state to connect the signal on line 26 to the fixed terminal 13 directly.

The switching means 43 and 45 are 'ganged' or switched between states in synchronism by means of the square wave switching signal from synchronisation generator 35 on line 34.

It will be appreciated that the switching means 43 and 45 may be provided conventionally by semiconductor switching devices. It will also be appreciated that inverting amplifiers 44 and 46 are not in operation simultaneously and that with the use of more complex switching means a single inverting amplifier having suitable operating characteristics may be employed instead.

The phase sensitive rectifier 36 comprises a simple switch, which may be a semiconductor device, in combination with storage capacitor 36' and capacitor charging resistors 36" and 36'''. The switch is opened and closed by synchronisation generator 35 in synchronism with the polarity reversal of the energising voltages at the fixed terminals 12 and 13 of the resistive element, being opened when the energisation polarity of fixed terminal 12 corresponds to the output of the integration means and closed when inverted. The time constant of capacitor 36' and resistor 36" combination is approximately equal to the switching period whereas the time constant of capacitor 36' and resistor 36''' combination is very much greater. Thus when the polarity change of the synchronisation generator causes any signal picked up from the resistive track to change between a negative and a positive value with respect to the integration datum the capacitor is charged by the magnitude of the change, although it only remains so until the switch is next closed. Apart from a small discharge by way of the resistor 36''' the voltage-time product per cycle of the rectifier switch providing the input to the integration means is equivalent to the amplified signal derived from the signal-tapping member applied throughout the cycle and the integrated signal reflects the level of the tapped signal.

The amplification means 38 comprises a pre-amplifier 47, which is carried with the signal-tapping electrode 37, and a amplifier section 48. The pre-amplifier is configured such that it both receives operating power and provides amplified electrode signals by way of the same conductor pair 49, 50. Operating current is derived by way of resistor 51 from supply line 52 and the amplified electrode signals are manifested as modulation of the operating current, the signals being decoupled therefrom by capacitor 53 at the input to amplifier part 48.

The pre-amplifier may be constructed as a miniature hybrid circuit readily screened with the electrode 37 and the provision of the signals by way of supply current modulation removes the need to screen further connecting or amplifying circuitry.

Depending upon the shape of the resistive element 11 and the extent and manner of motion required for tapping electrode 37, the form in which the signals are carried and the use of only two interconnecting conductors 49, 50 makes it readily feasible to include sliding contacts as shown at 54 and 55. For instance, the resistive element may comprise an arc of a circle such that the electrode 37 and pre-amplifier 47 are displaced by rotation about an axis, the conductors 49 and 50 then including sliding contacts 54 and 55 in the form of slip rings. Such slip rings may used to provide with less resistance to motion than a flexible conductor link or because any constant frictional drag introduced by the slip rings is preferable to a restoring torque, caused by rotation of a conductor link, which tends to increase with deflection from a datum position, or to enable a shaft carrying the signal-tapping electrode to make complete revolutions between orientations at which potentiometric measurements are possible.

It will be appreciated that the structure and form of the resistive material and non-contact-making electrode may take many forms depending on the use to which the potentiometric circuit arrange is put.

In its simplest form and/or where minimum resistance to electrode displacement is needed, the electrode 37 may be spaced from the surface of the resistive element by an air gap, as shown in FIG. 4(a) which is a sectional elevation through a resistive element 11 in the form of a flat 'track' deposited on substrate 11'. The resistive element 11 may be coated with a layer of dielectric material to protect it and provide a different capacitance and resistive element.

FIG. 4(b) shows an alternative construction in which the resistive element is coated with a layer 56 dielectric material against which the electrode 37 bears, possibly with a bias force to ensure a constant separation from the resistive element and constant capacitance. The dielectric material may be hard wearing and/or offer low friction to the electrode.

FIG. 4(c) shows yet another construction in which the electrode 37 is in the form of a spindle on which is mounted a roller 57 of dielectric material such that the electrode can be biased towards the resistive member but maintain a constant separation equal to the thickness of the roller which permits displacement of the electrode with low resistance to motion and little abrasive wear to the resistive element.

As shown in FIG. 4(d) combinations may be effected, such as the provision of both a roller 57' or other dielectric coating on the electrode 37 and a dielectric coating 56' on the resistive element 11.

The resistive element may take a form other than of a flat track, exemplary configurations of resistive element and signal-tapping electrode being illustrated in FIGS. 5(a) and 5(b).

In FIG. 5(a) a resistive element 58 is formed on the exterior surface of a hollow cylindrical substrate 59. The signal-tapping member, in the form of a cylindrical electrode 60 and preamplifier 61, is moved on shaft member 62 for reciprocal translation within, and along the axis of, the substrate 59.

In FIG. 5(b) the resistive element 63 is formed on the exterior of a cylindrical substrate 64, or possibly on the interior if it is hollow, and the signal-tapping member takes the form of a saddle-like or ring-like electrode 65 which with its pre-amplifier 66 is mounted for reciprocal translation provided to the longitudinal axis of the substrate.

Clearly the resistive material may conform to any path between the fixed electrodes provided the signal-tapping member is suitably mounted to translate it.

Similarly, it will be understood that in any configuration as above, the motion between resistive track and signal-tapping member is relative and either the resistive track or the signal-tapping member may be 'fixed' with respect to other apparatus whilst the other part undergoes motion.

The most common form of conventional potentiometer is that used in connection with angular motion wherein the resistive element is in the form of a flat track describing an arc of a circle centred on the rotational axis of a shaft carrying the normally contact-making wiper.

Many of the constructional details of such a device may be employed in an arrangement according to the invention in its preferred form, that is, based upon the arrangement of FIG. 3. As illustrated at 67 in FIG. 5(c), a flat arcuate resistive element 11 has associated therewith instead of a contact making wiper, a capacitively coupled signal-tapping electrode 37 with a pre-amplifier, 47, being mounted on rotatable shaft 67', and slip rings, 67'', 67''' provided for supplying current to, and signals from, the pre-amplifier.

An alternative angular rotation arrangement is shown at 68 in FIG. 5(d) wherein the resistive element 11 conforms to part of a cylindrical surface and the signal-tapping electrode 37 moves within, and is to some extent shielded mechanically and electrically by, the resistive element and/or more extensive substrate.

As mentioned above, and illustrated in FIG. 5(e) at 69, a potentiometric circuit arrangement for angular rotation may have its resistive element 11 carried by rotatable shaft 69' with its fixed contacts 12, 13 energised by way of slip rings 69'' and 69''' and the signal-tapping electrode 37 disposed on a relatively fixed part of external apparatus. In such arrangement, the small signal from the electrode does not have to pass by way of slip ring contacts and the amplification means 69'''' may comprise single amplification means without the facilities offered by pre-amplifier 47.

As indicated hereinbefore, the benefits of a.c. operation, namely the use of a non-contact-making signal-tapping member and, if desired, transformer coupling, may be realised with a cyclically varying, conveniently an intermittent, or 'chopped', d.c. energisation of the resistive element. However, it will be appreciated that by alternating the fixed terminal voltage between opposite polarities with respect to the integration datum the average, that is, d.c., level of voltage at any point on the resistive element is zero so that any variation in capacitance between tapping electrode or resistive element will not result in generation of a noise signal to contaminate the a.c. signal produced by displacement of the tapping electrode from an established null signal position. This may be of particular value when the signal-tapping electrode 37 is spaced from the resistive element by an air gap and the parts are subjected to vibrational or other forces on the signal-tapping electrode, varying the air gap and thus the capacitance.

It will be appreciated that the signal-to-noise performance of the a.c. potentiometer control arrangement improves with the frequency at which the fixed terminal energising voltages are alternated and the capacitance at the tapping electrode by which 'error' signals are coupled to the integration means. The former is a matter of choice, bearing in mind the desirability of avoiding a frequency near to any other potentially interfering equipment. The latter is a compromise between the use of a low-capacitance air gap between signal-tapping electrode and resistive track that offers no resistance to motion and a higher-capacitance solid dielectric with which the electrode makes contact but with potential stiction-induced non-linear response. The arrangement 40 of FIG. 3 demonstrates that the disadvantage of a low-impedance air dielectric can be mitigated by a suitable preamplifier design of low input capacitance.

As mentioned above the present invention is concerned with the use of the potentiometric circuit arrangement, as an alternative to a conventional potentiometer, in position measuring apparatus which gives an output signal amplitude, often a voltage, related to the relative position of two members or even the rate of change of relative position.

By way of example, FIG. 6 shows a cut-away view of a gyroscope 70 comprising a rotor 71, carried in a cage or gimbal 72 itself mounted on a shaft 73 for rotation about the longitudinal axis of the shaft within a housing 74. It is required to produce a voltage proportional to the angular rotation of the gimbal with respect to the housing from a fixed datum orientation and to produce a voltage proportional to the rate of rotation. Furthermore any transducer which provides such voltages must not place significant drag on the gimbal motion to interfere with accurate gyro operation. The potentiometric circuit arrangement 40 of FIG. 3 is employed and as described hereinbefore provides these voltage between terminals 19 and 20 and 28 and 20 respectively.

The resistive element is carried by the housing 74 and formed as an arc of a circle centred on the rotational axis of shaft 73 in the manner shown in FIG. 5(c). A signal-tapping member, in the form of electrode 37, is mounted on the shaft 73 to overlay the resistive element during rotation of the shaft and a pre-amplifier 47 is also mounted on the shaft, coupled to the electrode and screened with it by electrostatic screen 39. The pre-amplifier 47 is connected to the remaining circuitry by way of slip ring contacts 49 and 50. It will be seen that as well as providing the necessary electrical and signal requirements, the arrangement also operates without the friction that is required within normal potentiometers to give good signal levels, the only contacts being the slip rings. It will be appreciated that the use of slip rings is not mandatory and if the rotation of the shaft is limited the slip rings may be replaced by flexible conductors of low restoring force. Also, the form of the resistive track and its disposition in relation to the signal-tapping electrode may be varied, such as taking on of the form 68 or 69 shown in FIGS. 5(d) and 5(e) respectively.

The integrated signal provided by integration means that provide a measure of angular position of the gimbal is, by use of the features described above, sufficiently stable and free of electrical noise to be differentiated electronically in 27 to prove a rate of gimbal rotation signal.

It will be appreciated that in all of the above embodiments, the integrated signal need not be presented at an accessible terminal 19 if the arrangement is dedicated to providing just a rate signal.

All of the embodiments of potentiometric circuit arrangements in accordance with the invention described hereinbefore have included a resistive element having two distinct ends at which the resistive terminals are located and between which the signal-tapping member can move in a rectilinear or acuate path.

It will be appreciated that there are occasions when in an instrument similar to that of FIG. 6 a shaft is capable of making continuous rotations before settling at any particular shaft orientation and there is a requirement to ascertain the shaft orientation and the rate of shaft rotation.

In accordance with the present invention and as illustrated in the schematic circuit of FIG. 7, a 360° angular position and/or rate measuring potentiometric circuit arrangement 80 has, extending between two fixed terminals 81 and 82, a resistive element 83 which extends as a semi-circular arc about a shaft 84 rotatable about its longitudinal axis and supporting a signal-tapping member 85, preferably, but not necessarily, of the non-contact-making types described above in operational pick-off relationship with the resistive element 83. Amplification means 86, phase sensitive rectification means 87, integration means 88 and feedback means 89 correspond to those items 36, 38, 15 and 16' described above with reference to FIG. 2 or 3.

The arrangement 80 includes a further resistive element 90 extending also between the two fixed terminals 81, 82, in a complementary arcuate form and along which the signal-tapping member 85 can move separately from motion along the resistive element 83, that is, the resistive and further resistive elements combine to form a 360° cylinder resistive track and the signal-tapping member moves along each for separate 180° rotations of the shaft 84.

It will be appreciated that in operation the resistive element 83 and further resistive element 90 are in parallel and the same voltages appear on each at the same distance from the fixed terminal 81 so that an integrated signal giving an energising voltage V at terminal 81 may correspond to the shaft 84 holding the signal-tapping member at an angle $\theta°$ clockwise from terminal 81 or at an angle $(360-\theta)°$ clockwise or at an angle $\theta°$ anti-clockwise from terminal 81 or $(360-\theta)°$ anti-clockwise.

The measurement is clearly subject to ambiguity as to direction of shaft displacement, if both directions are possible, and degree of displacement in any particular direction.

To this end the arrangement 80 also includes ambiguity resolving means 91 to resolve ambiguity in the integrated signal produced by integration means 88. The means 91 comprises two further fixed terminals 92, 93 connected one each to the resistive elements 83 and 90 each at a point between the two fixed terminals 81 and 82, conveniently mid way, representing a 90° rotational displacement from terminals 81 and 82, duplicate integration means 94, duplicate feedback means 95 associated with the two further fixed terminals and the signal-tapping member 85 (and amplification means 86 and phase sensitive rectifier 87), to receive signals from the signal-tapping member and provide energising voltages to the two further fixed terminals 92 and 93, and time division multiplexing means 96. The multiplexing means 96 may be controlled by synchronisation generator 35 to direct signals from the signal-tapping member to either the original integration means 88 or duplicate integration means 94 and direct energising voltages from the corresponding original feedback means 89 or duplicate feedback means 95 to the respective two fixed terminals 81, 82 or two further fixed terminals 92, 93.

The integration means 88 and further integration means 94 produce integrated signals which, in addition to controlling energisation of the two fixed terminals and further fixed terminals uniquely define the position of the signal-tapping member with respect to fixed terminal 81.

Referring to FIG. 8 this shows the voltage levels relative to the integration datum applied to the fixed terminals 81, 82, 92 and 93 as a function of rotation angle of shaft 82 and assuming a 0° rotation angle when the signal-tapping member is adjacent fixed terminal 81.

Although the arrangement of FIG. 7 is shown with the feedback means having the preferred form of a.c. generating means effected by polarity switching of the integrated signals by synchronisation generator 35, the waveform diagram is drawn as if d.c. energised to show only the states of the feedback means in which the actual integrated signals (V) output from the integration means 88 and 94 are applied to fixed terminals 81 and 92 respectively and the difference between reference voltage X and the output from the integration means $(-(X-V))$ are applied to respective fixed related terminals 82 and 93, the waveforms of voltages $V_{81}$ and $V_{92}$ in the upper part of the diagram thus corresponding to variations in the integrated signals of the arrangement with shaft angle $\theta$. The resistive track energising voltages are shared between the two waveforms by the time division multiplexing although the integrated signals corresponding thereto are, of course, continuous.

Because of the time division multiplexing the outputs from original and duplicate integration means derived by using fixed terminal points 90° displaced are also displaced 90° in phase and enable the positional ambiguity to be resolved using techniques applicable to other types of angular measuring systems.

As will be seen from the waveforms of FIG. 8(a) the advantageous characteristic of the non-contact-making signal-tapping member picking off a signal that is a spatial average of the voltage about a particular position causes a rounding of the signal peaks and troughs of each integrated signal produced when the signal-tapping member is in the immediate vicinity of the fixed terminals associated with the integrated signal and detracts from the accuracy of relationship between integration signals and rotational position. However, it will also be seen that when the shaft position places the signal-tapping member in the vicinity of one fixed terminal it is mid way between the terminals of the other pair and the integrated signal associated with that other pair of terminals is at its most linear part between peak and trough.

Thus it is convenient to derive an output signal from the potentiometric circuit arrangement 80 by switching between, or combining with appropriate weighting, the integrated signals from the integration means 88 and further integration means 94 in accordance with amplitudes thereof that define the relationship between angular position of the signal-tapping member and the fixed terminals.

One method by which angular shaft position ambiguity can be resolved will be briefly explained with reference to FIGS. 8(b) and 8(c).

FIG. 8(b) shows a graphical representation of the variation of the energisation voltages $V_{81}$ and $V_{92}$ of FIG. 8(a) in terms of integrated signals $V_{88}$ and $V_{94}$, from which they are derived, as a function of shaft angle $\theta$ in degrees.

For convenience the reference level of the integrated signals has been restated as mid-way between their peak values, rather than the integration datum, as indicated by the multiply labelled ordinate scale.

It will be found convenient to refer to the integrated signal $V_{88}$ derived from integration means 88 (corresponding to $V_{81}$ in FIG. 8(a)) as A, where $A=V_{88}-X/2$, and to refer to the integrated signal $V_{94}$ derived from integration means 94 as B, where $B=V_{94}-X/2$. Thus in relation to the restated ordinate origin, A and B have values between $\pm X/2$ as the shaft moves through 180° sectors of rotation as marked on the second ordinate scale. The third ordinate scale of FIG. 8(b) expresses the values of A and B in terms of angular displacements from the restated origin whereby the values of A and B which vary between $\pm X/2$ can be expressed or used directly in terms of angles between $\pm 90°$.

It is convenient to divide the rotational cycle of the shaft into sectors, in this case each extending 45° centred on the peaks and crossovers of the individual waveforms and denoted by the regions marked 1 to 8 repetitively in FIG. 8(b).

It will be recalled that one of the aims of utilising both signals is to maximise the contribution made by each signal to the part of its waveform away from the rounded peaks.

To this end it will be seen that in shaft rotation sectors 1 and 5 waveform B is at its optimum linearity and in sectors 3 and 7 waveform A is at its optimum. In sectors 2, 4, 6 and 8 both waveforms progress between the optimum linear region and the rounded peak regions but in opposite sense.

It will be readily seen that given the "measured" values of A and B, in sector 1 the shaft angle $\theta$ (between 0° and 360°) is given by $$\theta = -B \quad (3),$$

ignoring for the moment that sector 1 straddles the 360°/0° boundary;

$$\text{in sector 3} \quad \theta = 90° + A \quad (4)$$
$$\text{in sector 5} \quad \theta = 180° + B \quad (5)$$
$$\text{in sector 7} \quad \theta = 270° - A \quad (6)$$

For the even number sectors the angle is derived from a combination of both signals. Given that signal B corresponds to signal A but shifted in phase by 90° a signal D can be derived therefrom for creating a weighted sum with signal A.

The signal D, shown graphically in FIG. 8(b) by the chain dotted line superimposed on waveform A, also, of course, has non-linearities due to the rounded peaks of B and these manifest as a discontinuities at the zero-crossing points. The signal D is defined by $$D = [90° - |B|] \cdot \text{sign } A \quad (7)$$

A weighing factor K is defined by $$K = (67.5 - |A|)/45 \quad (8)$$

The weighted signal A' that replaces A is given by
$$A' = (K \cdot A + (1-K) \cdot D) \quad (9)$$

so that in sectors 2 and 4 adjacent sector 3
$$\theta = 90 + A', \quad (10)$$

and in sectors 6 and 8 adjacent sector 7

$$\theta = 270° - A' \quad (11)$$

These even number sectors relationship may be expressed together as $$\theta = (90° + A') \cdot (-\text{sign } B) \quad (12)$$

although for digital processing they may be dealt with separately as described below with reference to FIG. 8(c) which shows a flow chart of the procedural steps in processing the signals A and B to provide a smoothly varying value for shaft angle $\theta$ which obviates the non-linear effects of the rounded peaks of waveforms A and B.

It will be seen that by testing the levels of A and B in relation to the 67.5° linearity boundary at 100 and 101 the even and odd sectors are distinguished and, if an odd sector is formed, whether it is 1 or 5 or 3 or 7. Depending upon the sign of the signal tested at 102, 103 respectively for each sector pair branch, the odd sectors angle is derived directly from the values of A and B at 104-107 in accordance with equations (3)-(6).

It will be appreciated that the signal B may represent an angle $\theta = 0°$ to 22.5° or an angle 337.5° to 360°, the former being characterised by B having a negative value and the latter by B having a positive value. The flow chart responds at 108 to such a positive value of B, by $\theta = -B$ being less than 0, to derive at 109 a value representing $(360-B)°$.

If an even sector is distinguished at 101 the sign of A is tested at 110 to distinguish between sector 4 and 6 (positive A) and sectors 2 and 8 (negative A) in order to derive expression D at 111, 112 respectively. The weighting factor K is computed for A at 113 and the weighted value of A, A', is computed at 114. In accordance with equations (10) and (11) and the value of A' effectively substituted for A, the test for sign B is performed at 103 and in accordance therewith the stages 105 or 107 derive $\theta$ as $(90+A')°$ or $(270-A')°$ as appropriate.

It will be appreciated that in a similar manner values of A and B differentiated with respect to time may also be combined in such a way as to mitigate the effects of non-linearities in the signals A and B due to shaft position.

It will be appreciated that the quantisation noise present in an angle measurement digitally derived as above precludes producing a rate signal therefrom and it is preferred to derive rates of change of A and B, that is, $\dot{A}$ and $\dot{B}$, and to process the rate signals digitally and in accordance with the instantaneous shaft position determining the forms of measured signals A and B.

By defining the aforementioned sectors 1 to 8 the rate $$\text{for sector 1 is } \dot{\theta} = -\dot{B} = \dot{B} \cdot \text{sign } A \quad (13)$$

$$\text{for sector 3 is } \dot{\theta} = \dot{A} = -\dot{A} \cdot \text{sign } B \quad (14)$$

$$\text{for sector 5 is } \dot{\theta} = \dot{B} = \dot{B} \cdot \text{sign } A \quad (15)$$

$$\text{for sector 7 is } \dot{\theta} = -\dot{A} = -\dot{A} \cdot \text{sign } B \quad (16)$$

and in the even numbered sectors $\theta$ is derived from a weighted sum $$\dot{\theta} = (1-K) \cdot [\dot{B} \cdot \text{sign } A] + K \cdot [-\dot{A} \cdot \text{sign } B] \quad (17)$$

when weighting factor $K = (67.5 - |A|)/45$ as specified in equation (8).

The flow chart of FIG. 8(d) illustrates the comparable steps taken to derive a continuous shaft rotation rate output from the two signals A and B and their individual rates Å and Ḃ.

The steps 120 and 121 distinguish between odd and even sectors of angular position. For sectors 1 and 5, the sign of A is tested at 122 and then value of $\theta$ computed at 123 or 124. Similarly for sectors 3 and 7 the sign of B is tested at 125 and the value of $\theta$ computed at 126 or 127. For even sectors the weighting factor K is computer at 128 and then the value of $\theta$ computed at 129 in accordance with equation (17). The values of $\theta$ derived separately by the different paths are delivered sequentially to output 130 as a continuous rate output.

It will be understood that the above is only exemplary of a particular form of deriving unambiguous signals from two phase-displaced components combined with a mechanism for preserving linearity despite the rounding of waveform peaks caused by the tapping of a spatial average signal.

An alternative form of ambiguity resolving means is shown at 91' in FIG. 9, the remaining components of the potentiometric circuit arrangement corresponding to, and being given the same reference numbers as in, FIG. 7.

The ambiguity resolving means 91' comprises a duplicate 140 of the combination of resistance element 83 and further resistance element 90 with two fixed terminals 141 and 142 and disposed parallel to the original combination such that a signal-tapping member 85' moves along, and derives signals from both the original and duplicate resistive element and further resistive element combinations. The fixed terminals 141 and 142 on the duplicate combination 140 are offset 90° about shaft 84 from the fixed terminals 81, 82 of the original combination and receive energising voltages from duplicate feedback means 143 controlled by duplicate integration means 144 which receives signals from duplicate signal-tapping member 85' by way of amplification means 86 and phase sensitive rectifier 87.

The separate integrated signals from integration means 88 and 104 together, by virtue of their 90° phase shift, uniquely define the position of the signal-tapping members 85 and 85' with respect to the two fixed terminals 81, 82 of the original combination of resistive elements and further resistive elements; the signals may be continuously derived without any requirement for multiplexing the energisation of the resistive tracks and may also be subjected to differentiation at 97 and 98 before any combination of the signal is made.

Alternatively, the arrangement may be provided with a single signal-tapping member and amplifier common to both original and duplicate resistive elements as shown in FIG. 10.

This corresponds generally to that shown in FIG. 9 except that the resistive tracks are also shown as coplanar concentric rings with the single signal-tapping member 85 bridging both rings.

The synchronisation generator 35 is arranged to define separate energising frequencies for the original and duplicate resistive track combinations and a simple filter 86', conveniently associated with the pick-off amplification means 86, is disposed between the amplification means and integration means to separate error signals associated with either or both of the original or duplicate resistive track combinations and deliver them to the appropriate integration means.

It will be appreciated that although a 360° rotation is the most common form of a continuous resistive element path from which ambiguity of signal-tapping member needs resolving the techniques for resolving ambiguities are applicable to other configurations and different phase relationships.

In addition to deriving from the basic linear potentiometric circuit arrangements one which copes with continuous linear motion about a closed path there may be derived a potentiometric circuit arrangement 145, FIG. 11, which is able to define the position of the signal-tapping member in a two dimensional region defined by a resistive element.

Referring to FIG. 11 a resistive element 146 extends between two fixed terminals 147, 148 in a longitudinal direction, denoted by arrow 149, and is extensive in a direction, denoted by arrow 150, orthogonal to said longitudinal direction to define a two-dimensional resistive region 151. The signal-tapping member 152 is movable with respect to the resistive element in both the longitudinal and orthogonal directions, conveniently freely movable with components of the motion in those directions.

The signal-tapping member 152 provides signals by way of amplification means 153 and phase sensitive rectifier 154 to integration means 155, the latter providing an integrated signal to feedback means 156 which energises fixed terminals 147 and 148. The arrangement 145 also includes coordinate resolving means shown generally at 157 operable to determine a point in the resistive region 151 by the disposition of the signal-tapping member with respect to the fixed terminal 147 in both the longitudinal and orthogonal directions.

As shown in FIG. 11 the coordinate resolving means 157 comprises a duplicate resistive element 158 substantially parallel to the original resistive element 146 such that the signal-tapping member 152 moves along both original and duplicate resistive elements in both longitudinal and orthogonal directions. The duplicate resistive element has two fixed terminals 159, 160 separated in the orthogonal direction and duplicate integration means 161 and feedback means 162 associated with, and operable to provide signals representative of the position of the signal-tapping member 152 between, fixed terminals 159 or 160. In a manner described above in relation to FIG. 10 the original and duplicate resistive elements are energised at different frequencies and a filter 153' associated with the pick-off amplification means 153 directs the error signals tapped by the pick-off to the appropriate integration means.

The integration means 155 and duplicate integration means 161 produce integrated signals which together uniquely define the position of the signal-tapping member 112 in the two-dimensional resistive region. The position signals may also be differentiated before use or combination in differentiation means 162, 163.

If desired, and in a manner similar to that described with reference to FIG. 9 a duplicate signal-tapping member may be provided to separate the tapped signals completely.

As indicated above in relation to resolving positional ambiguity from two such component signals, the resolving of position from two such signals involves corresponding techniques and will not be described further.

An alternative form of coordinate resolving means is shown at 157' in FIG. 12 and comprises a pair of subsidiary fixed terminals 165, 166 contacting the resistive element 146 defining region 151 at points between the fixed terminals 147, 148 at opposite sides of the element separated in the orthogonal direction 150. Duplicate integration and feedback means 167 and 168 respectively are associated with the subsidiary fixed terminals to provide energising signals thereto representative of the position of the signal-tapping member 152 between terminals 165 and 166. Time division multiplexing means 169 is operable to direct signals from the signal-tapping member alternately to either the original integration means 155 or duplicate integration means 167 and synchronously direct energising voltages from corresponding original feedback means 156 or duplicate feedback means 168 to the respective terminals 147, 148 or subsidiary terminals 165, 166. The separate integrated signals delivered by the original integration means 155 and the duplicate integration means 167 together uniquely define the position of the signal-tapping member in the resistive region 151.

It will be appreciated that one but not both of the fixed terminals pair 147, 148 or subsidiary pair 165, 166 may extend along the edge of the resistive element to provide equipotentials between those terminals which extend in the direction of separation of the other terminal pair, but the terminals of the other pair must make only point contact. In such arrangement there is an inherent non-linear relationship between the integration means outputs, which define null position and the actual position in terms of distances between the fixed terminals. However, such a device is capable of computing a correction factor derived from the values of the two signals or calibration with such a correction being built into a readily accessed look-up table.

The signals may be combined or used in any known manner and, as indicated above, the signals may be differentiated at 162, 163 to provide signals defining the velocity of signal-tapping member displacements.

It will be appreciated that if the signal-tapping member 152 of FIG. 11 is caused to translate so as to describe a circular path adjacent the two-dimensional resistive element 146 the integrated signal from integration means 155 will vary sinusoidally. Furthermore, the signal from integration means 161 associated with the orthogonally disposed resistive element 158 of the resolving means will vary 90° out of phase, the whole arrangement providing both sine and cosine outputs for resolving ambiguities or to perform other functions.

The signal-tapping member 152 may be carried by, and moved with, an arm 170 as shown and undertake circular motion by being coupled to a rotating device by a crank or eccentric. Alternatively, and more practicably, the signal-tapping member 152 is carried in the manner illustrated in FIG. 13 on a radial arm 171 fixed to a shaft 173 which rotates about an axis within the boundary of the resistive element 146. A duplicate resistive element corresponding to, and energised in the manner of, 151 in FIG. 11, or possibly a duplicate signal-tapping member (not shown) displaced 90° about the shaft, enables both analogue sine and cosine signal outputs to be used directly or for deriving rate signals.

To ensure a true sinusoidal relationship between shaft angle and energising voltage it is necessary to have a uniform voltage gradient between fixed terminals and equipotential which extend truely orthogonal to them within the plane of the element. To this end the resistive element should preferably not be apertured for the shaft to pass therethrough, although it is believed that in practice if the radius of the locus of signal-tapping member is large in relation to any aperture in the resistive element an accurate sinusoidal relationship between shaft angle and integrated signal is obtainable.

Whereas the structure of FIG. 13 may appear somewhat clumsy in relation to the many purpose built sine/cosine potentiometers already available, given the problems traditionally associated with depositing uniform areas of resistive materials for potentiometric devices, it is to be realised that by virtue of the non-contact-making relationship possible between signal-tapping member and resistive element, the latter can be formed of suitable materials chosen solely for the resistivity and uniformity of deposition, not the ability to withstand contact wear nor even contact with the atmosphere. The resistive element may thus be formed a thin film of pure metal or alloy requiring minimal trimming to give uniform resistivity and, if the metal or alloy is prone to oxidation, a protective dielectric coating may be provided.

I claim:

1. A potentiometric circuit arrangement comprising a resistive element extending between two fixed terminals, a signal-tapping member movable along the resistive element to derive a signal from the resistive element, integration means operable to integrate with respect to an integration datum a signal derived from the signal-tapping member and provide an integrated signal and feedback means including means, including a source of reference voltage of amplitude in excess of the maximum integrated signal amplitude and algebraic summing means, operable to apply to one of said fixed terminals a voltage related to the amplitude of the reference voltage reduced by the amplitude of the integrated signal and means operable to apply to the other of said fixed terminals a voltage related to the amplitude of the integrated signal but of opposite polarity, with respect to the integration datum, to the voltage applied to said one of the fixed terminals such that a voltage having a peak amplitude equal to the reference voltage exists between the fixed terminals and a null voltage, with respect to said integration datum, exists at some position between the fixed terminals, said integration means being responsive to variation of the input signal thereto by displacement of the signal-tapping member from said null voltage position towards either fixed contact to vary the amplitudes of the signals applied to the fixed terminals relative to each other to restore the null voltage to the position of signal-tapping member and to provide said integrated signal amplitude as a function of the position of the signal-tapping member with respect to the fixed terminals.

2. A potentiometric circuit arrangement as claimed in claim 1 in which the voltages applied to said two fixed terminals are controlled such that said reference voltage amplitude exists between the fixed terminals.

3. A potentiometric circuit arrangement as claimed in claim 1 in which the feedback means includes voltage varying means operable to supply to each of said two fixed terminals voltages whose instantaneous values with respect to the integration datum vary together cyclically as a function of time at a rate greater than permitted variation of position of the signal-tapping member.

4. A potentiometric circuit arrangement as claimed in claim 3 in which the feedback means includes a.c. generating means operable to supply to each of the fixed terminals a voltage alternating in polarity with respect to the integration datum and including rectification means between the signal-tapping member and integration means operable to derive a unipolar signal for input to the integration means.

5. A potentiometric circuit arrangement as claimed in claim 4 in which the rectification means is a phase sensitive rectifier coupled to the a.c. generating means.

6. A potentiometric circuit arrangement as claimed in claim 4 in which the a.c. generating means comprises a synchronisation generator of a switching signal having a square waveform, inverting means operable to derive, from each of the integrated signal and the algebraic sum of the integrated signal and reference voltage, voltage signals of opposite polarity thereto with respect to the integration datum and switching means, responsive to the switching signal, to alternate the polarity of voltage signal applied to each of the fixed terminals.

7. A potentiometric circuit arrangement as claimed in claim 1 in which the signal-tapping member comprises a signal-tapping electrode disposed adjacent to, but not in contact with, the resistive element and capacitively coupled thereto to sense the spatial average of the voltage over said adjacent region of resistive element.

8. A potentiometric circuit arrangement as claimed in claim 7 in which the signal-tapping electrode is spaced from the resistive element by a layer of dielectric material.

9. A potentiometric circuit arrangement as claimed in claim 1 in which the signal-tapping member has associated therewith amplification means including a pre-amplifier, said pre-amplifier and signal-tapping member being electrostatically screened to prevent pick-up of signals other than from the resistive element by the signal-tapping member and said pre-amplifier being arranged to provide said signals by modulation of operating current supplied to the pre-amplifier.

10. A potentiometric circuit arrangement as claimed in claim 9 in which the pre-amplifier is mounted, and movable, with the signal-tapping member and arranged to receive operating power and provide signals by way of sliding contacts.

11. A potentiometric circuit arrangement as claimed in claim 1 comprising a further resistive element extending also between the two fixed terminals and along which the signal-tapping member can move separately from motion along the said resistive element and means to resolve ambiguity in the integrated signal of the position of the signal-tapping member in relation to its position between the two fixed terminals along the resistive element or further resistive element.

12. A potentiometric circuit arrangement as claimed in claim 11 in which the means to resolve ambiguity comprise a duplicate combination of resistive element and further resistive element, with two fixed terminals, disposed parallel to the original resistive element and further resistive element combination such that a signal-tapping member moves along, and derives signals from, each of the original and duplicate resistive element and further resistive element combinations, duplicate integration means and feedback means associated with the fixed terminals of the duplicate combination and with the signal-tapping member, the disposition of fixed terminals on the duplicate combination being offset, with respect to the signal-tapping member motion, from the fixed terminals on the original combination such that the separate integrated signals controlling energising of the fixed terminals of the original and duplicate combinations together uniquely define the position of the signal-tapping member with respect to the two fixed terminals of the original resistive element and further resistive element combination.

13. A potentiometric circuit arrangement as claimed in claim 12 in which the means to resolve ambiguity includes means to vary the voltages to the fixed terminals of the original and duplicate resistive element and further resistive element combinations as a function of time such that the original and duplicate combinations are energised in different frequency bands, a signal-tapping member operable to derive signals from both combinations simultaneously and filter means disposed between the signal-tapping member and the original and duplicate integration means operable to direct signals from the signal-tapping member to the appropriate integration means in accordance with the energisation frequency band of the resistive element combination associated therewith.

14. A potentiometric circuit arrangement as claimed in claim 11 in which the means to resolve ambiguity comprises two further fixed terminals connected one each to the resistive element and the further resistive element at a point between said two fixed terminals, duplicate integration means and feedback means associated with said two further fixed terminals and said signal-tapping member to receive signals from the signal-tapping member and provide energising voltages to the two further fixed terminals, time division multiplexing means operable to alternately direct signals from the signal-tapping member to either the original or duplicate integration means and direct energising voltages from the corresponding original or duplication feedback means to the respective two fixed terminals or two further fixed terminals such that the separate integrated signals controlling energising of the two fixed terminals or the two further fixed terminals together uniquely define the position of the original tapping member with respect to the two fixed terminals of the resistive element and further resistive element combination.

15. A potentiometric circuit arrangement as claimed in claim 1 in which the resistive element extends between the said two fixed terminals in a longitudinal direction and is extensive in a direction orthogonal to said longitudinal direction to define a two-dimensional resistive region, the signal-tapping member is also movable with respect to the resistive element in said orthogonal direction and including coordinate resolving means operable to determine a point in the resistive region by the disposition of the signal-tapping member with respect to the fixed terminals in both the longitudinal and orthogonal directions.

16. A potentiometric circuit arrangement as claimed in claim 15 in which the coordinate resolving means comprises a duplicate resistive element substantially parallel to the original resistive element such that the signal-tapping member moves along both said original and duplicate resistive elements in said longitudinal and orthogonal directions, the duplicate resistive element having two fixed terminals separated in said orthogonal direction, duplicate integration and feedback means, associated with said signal-tapping member and operable to provide signals representative of the position of said signal-tapping member between the fixed terminals of the duplicate resistive element and the said orthogonal direction such that the integrated signals controlling energising of the fixed terminals of the original and duplicate resistive elements together uniquely define the position of the signal-tapping member in the resistive region, and means to vary the voltages to the fixed terminals of the original resistive element and the duplicate resistive element as a function of time such that the resistive elements are energised in different frequency bands and filter means disposed between the signal-tapping member and the original and duplicate integration means operable to direct signals from the signal-tapping member to the appropriate integration means in accordance with the energisation frequency band of the resistive element associated therewith.

17. A potentiometric circuit arrangement as claimed in claim 15 in which the coordinate resolving means comprises a duplicate resistive element substantially parallel to the original resistive element such that the signal-tapping member moves along both said original and duplicate resistive elements in said longitudinal and orthogonal directions, the duplicate resistive element having two fixed terminals separated in said orthogonal direction, a duplicate signal-tapping member fixed in relation to the original signal-tapping member associated with the duplicate signal-tapping member and duplicate integration and feedback means, operable to provide signals representative of the position of said original signal-tapping member between the fixed terminals of the duplicate resistive element in the said orthogonal direction such that the integrated signals controlling energising of the fixed terminals of the original and duplicate resistive elements together uniquely define the position of the signal-tapping members in the resistive region.

18. A potentiometric circuit arrangement as claimed in claim 15 in which the coordinate resolving means comprises a pair of subsidiary fixed terminals contacting the resistive element between said fixed terminals at opposite sides of the element separated in the said orthogonal direction, duplicate integration and feedback means associated with and operable to provide energising signals representative of the position of said signal-tapping member between the subsidiary fixed terminals and time division multiplexing means operable to alternately direct signals from the signal-tapping member to either the original or duplicate integration means and direct energising voltages from the corresponding original or duplicate feedback means to the respective two fixed terminals or two subsidiary fixed terminals such that the separate integrated signals together uniquely define the position of the signal-tapping member in the resistive region.

19. A potentiometric circuit arrangement as claimed in claim 1 including differentiation means responsive to the integrated signal, representing the position of the signal-tapping member with respect to the fixed terminals, to provide a signal representative of the rate of change of position of the signal-tapping member.

20. A velocity determining arrangement for determining the relative velocity of two relatively movable parts of a body, including a potentiometric circuit arrangement as claimed in claim 19 in which the resistive element is carried by one of said parts and the signal-tapping member is carried by the other of said parts.

* * * * *